United States Patent
Funayama (10) Patent No.: US 11,373,858 B2
(45) Date of Patent: Jun. 28, 2022

(54) ABRASIVE GRAINS, EVALUATION METHOD THEREFOR, AND WAFER MANUFACTURING METHOD

(71) Applicant: SUMCO Corporation, Tokyo (JP)

(72) Inventor: Makoto Funayama, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 407 days.

(21) Appl. No.: 16/348,345

(22) PCT Filed: Sep. 7, 2017

(86) PCT No.: PCT/JP2017/032249
§ 371 (c)(1),
(2) Date: May 8, 2019

(87) PCT Pub. No.: WO2018/088009
PCT Pub. Date: May 17, 2018

(65) Prior Publication Data
US 2020/0058484 A1   Feb. 20, 2020

(30) Foreign Application Priority Data
Nov. 10, 2016 (JP) .............................. JP2016-219393

(51) Int. Cl.
*H01L 21/02* (2006.01)
*B28D 5/04* (2006.01)
*C09K 3/14* (2006.01)

(52) U.S. Cl.
CPC ........ *H01L 21/02013* (2013.01); *B28D 5/042* (2013.01); *C09K 3/1409* (2013.01); *C09K 3/1463* (2013.01)

(58) Field of Classification Search
None
See application file for complete search history.

(56) References Cited

U.S. PATENT DOCUMENTS 5,710,069 A * 1/1998 Farkas .................... B24B 37/04
216/85
7,429,367 B2 * 9/2008 Lee ...................... C09K 3/1409
423/263

(Continued)

FOREIGN PATENT DOCUMENTS

JP    2000-61843    2/2000
JP    2004-255534   9/2004

(Continued)

OTHER PUBLICATIONS

International search report issued in International Patent Application No. PCT/JP2017/032249, dated Nov. 28, 2017.

*Primary Examiner* — Stephanie P Duclair
(74) *Attorney, Agent, or Firm* — Greenblum & Bernstein, P.L.C.

(57) ABSTRACT

Provided are abrasive grains, an evaluation method and a wafer manufacturing method. A predetermined amount of abrasive grains is prepared as an abrasive grain sample group, the grain diameter of individual abrasive grains in the abrasive grain sample group is measured, the number of abrasive grains in the abrasive grain sample group as a whole is counted, abrasive grains having a grain diameter equal to or smaller than a predetermined reference grain e diameter criterion which is smaller than the average grain diameter of the abrasive grain sample are defined as small grains and the number of the small grains is counted, a small grain ratio is calculated as the number ratio of the small grains occupied in the abrasive grain sample group as a whole, and a determination is made as to whether or not the small grain ratio is equal to or smaller than a predetermined threshold value.

3 Claims, 7 Drawing Sheets

(56) References Cited

U.S. PATENT DOCUMENTS

| | | | |
|---|---|---|---|
| 9,260,643 B2 | 2/2016 | Kitagawa | |
| 2002/0022441 A1* | 2/2002 | Sugai | B24B 57/02 |
| | | | 451/60 |
| 2015/0000208 A1* | 1/2015 | Kitagawa | B28D 5/007 |
| | | | 51/307 |
| 2017/0362465 A1 | 12/2017 | Ashitaka et al. | |

FOREIGN PATENT DOCUMENTS

| | | |
|---|---|---|
| JP | 2005-039174 | 2/2005 |
| JP | 2011-218516 | 11/2011 |
| JP | 2013-091141 | 5/2013 |
| TW | 201630810 | 9/2016 |
| WO | 2016/117560 | 7/2016 |

* cited by examiner

ABRASIVE GRAINS, EVALUATION METHOD THEREFOR, AND WAFER MANUFACTURING METHOD

TECHNICAL FIELD

The present invention relates to abrasive grains and an evaluation method therefor and, more particularly, to abrasive grains used in a slicing step using a loose grain wire saw and an evaluation method therefor. The present invention also relates to a wafer manufacturing method including a step of slicing an ingot using a slurry containing such abrasive grains.

BACKGROUND ART

A slicing step is one of the manufacturing processes for silicon wafer which is a semiconductor device substrate material. A wire saw is used in the slicing step, and a number of silicon wafers each having a fixed thickness are produced by slicing a silicon single crystal ingot grown by, e.g., a CZ method using a loose grain wire saw.

Regarding the slicing using the loose grain wire saw, for example, Patent Document 1 describes that a slurry obtained by mixing abrasive grains having an average circularity of 0.900 or larger and a coolant is used. Further, Patent Document 2 describes that, in a method of recycling a slurry by recovering effective abrasive grains from used slurry, removing worn-out abrasive grains, and adding new abrasive grains in an amount corresponding to the removed abrasive grains, the average circularity of the new abrasive grains is set in a range of 0.855 to 0.875, the weight ratio of the new abrasive grains is set to approximately 20%, and the average circularity of the abrasive grains contained in the recycled slurry is set in a range of 0.870 to 0.885.

Further, Patent Document 3 describes that an additional abrasive grain group is prepared, and a predetermined amount of the additional abrasive grain group is added to and blended with an abrasive grain group used in cutting processing, and sorting processing is performed on the blended abrasive grain group so that the grain size becomes equal to or larger than a first abrasive grain diameter and equal to or smaller than a second abrasive grain diameter. According to this method, the blended abrasive grain group can be used to carry out a polishing step the quality of which is equivalent to that of the new abrasive grain group while reducing the amount of abrasive grains to be discarded. Further, Patent Document 4 describes a slurry tank capable of uniformly dispersing abrasive grains in a coolant without aggregation. When this slurry tank is used, a slurry with no aggregates is supplied to a wire saw to stabilize slicing work, thereby obtaining a wafer excellent in quality stability.

CITATION LIST

Patent Document

[Patent Document 1] Japanese Patent Application Laid-Open No. 2013-91141
[Patent Document 2] Japanese Patent Application Laid-Open No. 2004-255534
[Patent Document 3] Japanese Patent Application Laid-Open No. 2011-218516
[Patent Document 4] Japanese Patent Application Laid-Open No. 2000-61843

SUMMARY OF THE INVENTION

Problem to be Solved by the Invention

In the slicing of an ingot using the wire saw, abrasive grains are inspected with respect to predetermined quality evaluation items, such as grain size distribution or circularity thereof for stabilizing machining quality, and only the abrasive grains satisfying a certain quality criterion are used.

However, even when the conventional abrasive grains satisfying the quality criterion are used to perform slicing, the flatness of a wafer is sometimes good and sometimes bad. Thus, wafer machining quality is not satisfactorily stabilized.

The object of the present invention is therefore to provide abrasive grains capable of improving the flatness of a wafer sliced by a loose grain wire saw and stabilizing machining quality and an evaluation method therefor. Another object of the present invention is to provide a wafer manufacturing method including a step of slicing a wafer using a slurry containing such abrasive grains.

Means for Solving the Problem

To solve the above problem, an abrasive grain evaluation method according to the present invention includes: preparing a predetermined amount of abrasive grains as an abrasive grain sample group; measuring the grain diameters of individual abrasive grains in the abrasive grain sample group and counting the number of the abrasive grains in the abrasive grain sample group; defining abrasive grains having a grain diameter equal to or smaller than a predetermined diameter criterion which is smaller than the average grain diameter of the abrasive grain sample group as small grains and counting the number of the small grains; calculating a small grain ratio which is the number ratio of the small grains occupied in the abrasive grain sample group; and determining whether or not the small grain ratio is equal to or smaller than a predetermined threshold value.

According to the present invention, it is possible to eliminate causes of deterioration in the flatness of a wafer by evaluating the amount of small grains included in the abrasive grain sample group by the number ratio, thereby making it possible to improve and stabilize wafer slicing quality.

The abrasive grain evaluation method according to the present invention preferably includes: measuring the grain size distribution based on the volume of the abrasive grain sample group from the grain diameters of the individual abrasive grains in the abrasive grain sample group; calculating the average grain diameter of the abrasive grain sample group from the measured grain size distribution; and defining the abrasive grains distributed in an area equal to or smaller than a grain diameter criterion which is smaller than the average grain diameter, as the small grains. Further, the grain diameter criterion is preferably ½ of the average grain diameter. Thus, the small grains can be clearly and easily defined.

In the present invention, the threshold value is preferably 50%. When the small grain ratio of the abrasive grains is equal to or smaller than 50%, it is possible to produce a wafer having satisfactory flatness and to stabilize wafer machining quality.

In the present invention, when the small grain ratio is equal to or smaller than the threshold value, it is preferably determined that the abrasive grain sample group can be used in slicing of an ingot by a wire saw, while when the small grain ratio is larger than the threshold value, it is preferably determined that the abrasive grain sample group cannot be used in the slicing. By prohibiting the use of the abrasive grains having a small grain ratio which is larger than the threshold value, the wafer flatness and wafer machining quality can be improved.

Abrasive grains according to the present invention are abrasive grains whose small grain ratio, which is the number ratio of small grains occupied in an abrasive grain sample group, is 50% or less, as a result of: measuring the grain diameters of individual abrasive grains in the abrasive grain sample group and counting the number of the abrasive grains in the abrasive grain sample group; and defining abrasive grains having a grain diameter equal to or smaller than a predetermined diameter criterion which is smaller than the average grain diameter of the abrasive grain sample group, as the small grains and counting the number of the small grains. According to the present invention, it is possible to manufacture a wafer having satisfactory flatness by way of slicing of an ingot using a wire saw and to stabilize wafer machining quality.

A wafer manufacturing method according to the present invention includes a slicing step of slicing an ingot using a loose grain wire saw with a slurry containing the abrasive grains of the present invention having the above features. According to the present invention, it is possible to manufacture a wafer having satisfactory flatness and to stabilize wafer machining quality.

Further, a wafer manufacturing method according to the present invention includes an inspection step of inspecting abrasive grains in terms of quality; and a slicing step of slicing an ingot using a loose grain wire saw with a slurry containing abrasive grains that have passed the inspection. The inspection step includes a small grain ratio inspection step of inspecting the small grain ratio of the abrasive grains. The small grain ratio inspection step includes: preparing a predetermined amount of abrasive grains as an abrasive grain sample group; measuring the grain diameters of individual abrasive grains in the abrasive grain sample group and counting the number of the abrasive grains in the abrasive grain sample group; defining abrasive grains having a grain diameter equal to or smaller than a predetermined diameter criterion which is smaller than the average grain diameter of the abrasive grain sample group, as small grains, and counting the number of the small grains; calculating a small grain ratio which is the number ratio of the small grains occupied in the abrasive grain sample group; and determining whether or not the small grain ratio is equal to or smaller than a predetermined threshold value. According to the present invention, it is possible to manufacture a wafer having satisfactory flatness and to stabilize wafer machining quality.

Advantageous Effects of the Invention

According to the present invention, it is possible to provide abrasive grains capable of improving the flatness of a wafer sliced by a loose grain wire saw and stabilizing machining quality and an evaluation method therefor. Further, according to the present invention, it is possible to provide a wafer manufacturing method including a step of slicing a wafer using a slurry containing such abrasive grains.

DETAILED DESCRIPTION OF THE EMBODIMENTS

Hereinafter, a preferred embodiment of the present invention will be described in detail with reference to the accompanying drawings.

Figure 1:
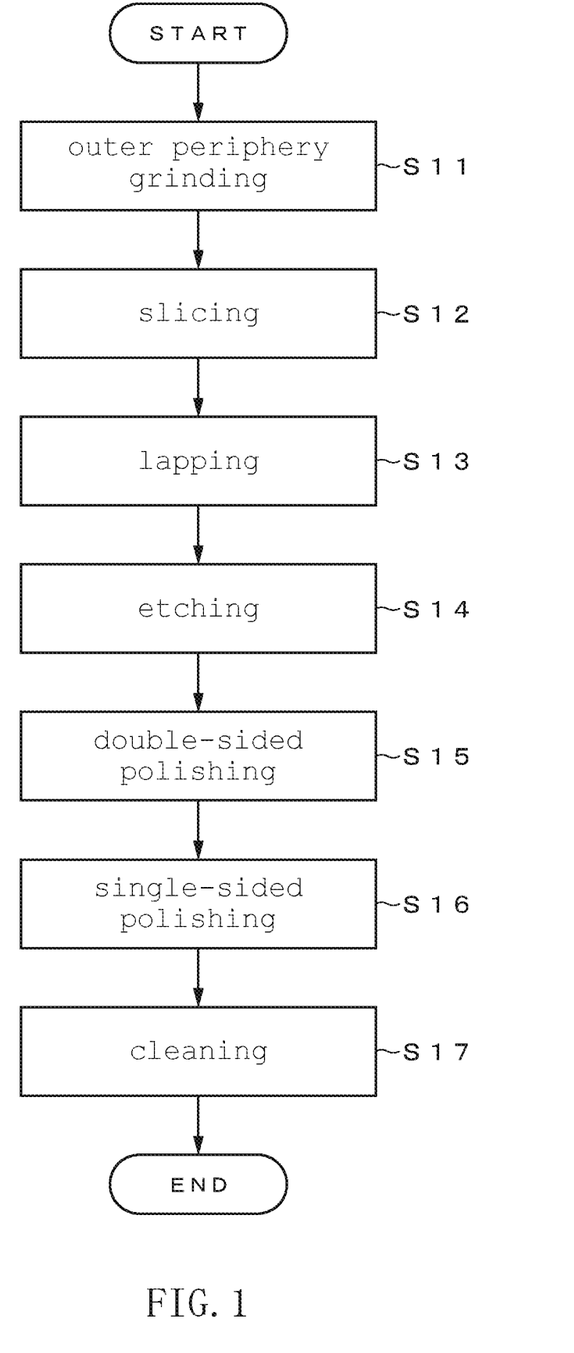
FIG. 1 is a flowchart for explaining a silicon wafer manufacturing method.

FIG. 1 is a flowchart for explaining a silicon wafer manufacturing method.

As illustrated in FIG. 1, a silicon wafer is manufactured by sequentially carrying out an outer periphery grinding step S11, a slicing step S12, a lapping step S13, an etching step S14, a double-sided polishing step (rough polishing) S15, a single-sided polishing step (mirror surface polishing) S16, a cleaning step S17, and the like. Of the above steps, the slicing step S12 is a step of slicing a silicon single crystal ingot using a loose grain wire saw, whereby a number of silicon wafers each having a fixed thickness are produced.

Figure 2:
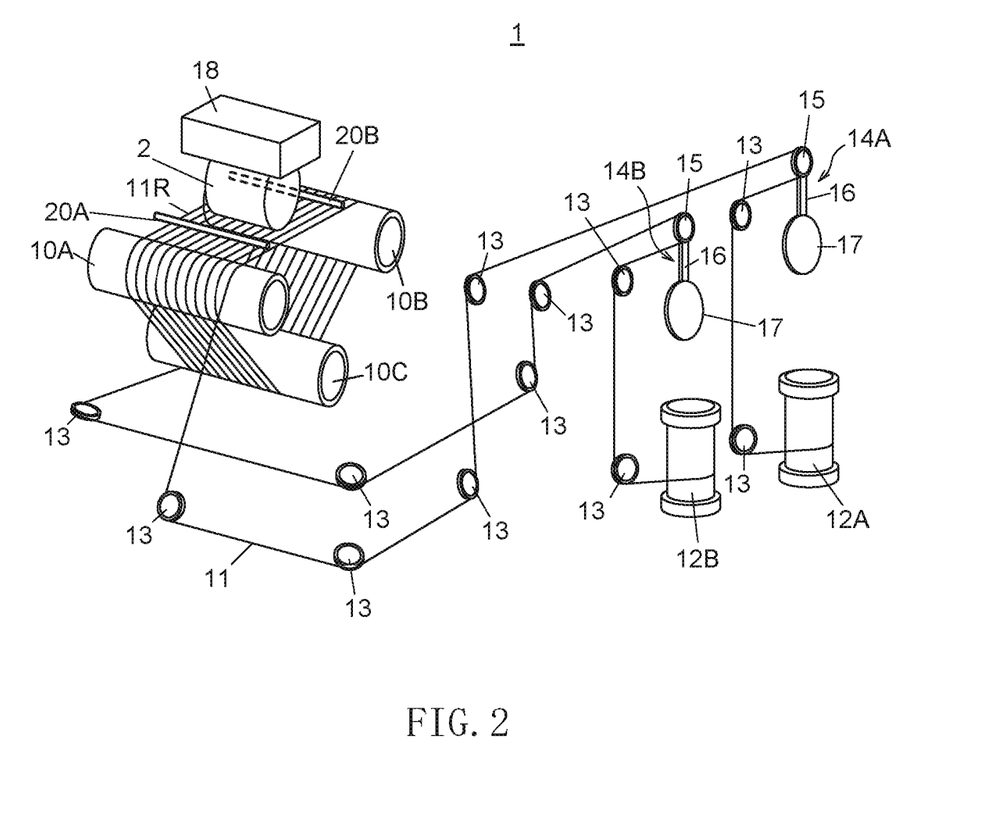
FIG. 2 is a perspective view schematically illustrating the configuration of the loose grain wire saw.

FIG. 2 is a perspective view schematically illustrating the configuration of the loose grain wire saw.

As illustrated in FIG. 2, a loose grain wire saw 1 is what is called multi-wire saw and includes three parallel main rollers 10A, 10B, and 10C, wire lines 11R arranged at a fixed pitch between the main rollers 10A and 10B which are formed by helically winding one wire 11 over the three rollers 10A, 10B, and 10C, slurry nozzles 20A and 20B for supplying a slurry to the wire lines 11R, and a lifting device 18 for a silicon single crystal ingot 2. A number of annular grooves are formed at a fixed pitch in the outer peripheral surface of each of the main rollers 10A, 10B, and 10C, and the wire lines 11R are formed by winding the wire 11 in multiple turns with the wire 11 fitted to the annular grooves. The wire lines 11R reciprocally run between the main rollers 10A and 10B by rotation of the main rollers 10A, 10B, and 10C. The ingot 2 is pressed against the wire lines 11R and is thereby cut off.

One reel 12A is a wire supply reel around which a new wire is wound, and the other reel 12B is a wire collection reel for winding a used wire. The wire 11 is fed from the one reel 12A, passing through a plurality of guide rollers 13, repeatedly wound over the main rollers 10A, 10B, and 10C in this order, passing through the plurality of guide rollers 13 once again, and wound by the other reel 12B.

A tension adjusting mechanism 14A is provided on the travel path of the wire 11 between the one reel 12A and the main roller 10A, and a tension adjusting mechanism 14B is provided on the travel path of the wire 11 between the other reel 12B and the main roller 10C. The tension adjusting mechanisms 14A and 14B are each constituted of a dancer roller 15 around which the wire 11 is wound, a dancer arm 16 rotatably supporting the dancer roller 15, and an actuator 17 supporting the dancer arm 16, and each impart an appropriate tension to the wire 11 by utilizing the drive force of the actuator 17.

While the wire 11 reciprocally runs in a direction from the one reel 12A toward the other reel 12B or in its opposite direction, it is possible to continue to gradually supply the new wire by making the feeding amount of the wire 11 from the reel 12A larger than the feeding amount of the wire 11 from the reel 12B. The reels 12A and 12B are driven by a not-shown torque motor.

During the cutting, a slurry is supplied to the wire lines 11R from the slurry nozzles 20A and 20B. The slurry is supplied from a not-shown slurry tank to the slurry nozzles 20A and 20B through piping. The slurry nozzles 20A and 20B each have a number of nozzle holes positioned above the wire 11 constituting the wire lines 11R, and the slurry ejected from the nozzle holes flows downward like a curtain onto the running wire 11 constituting the wire lines 11R. The slurry adhering to the wire 11 reaches the cutting point of the ingot together with the running wire 11, and the ingot 2 is cut by the wire 11 to which the slurry adheres.

The slurry is obtained by dispersing abrasive grains in a water-soluble or oil coolant. The material of the abrasive grains is preferably SiC, $Al_2O_3$, or the like, and the coolant is preferably a glycol-based coolant. In order to ensure wafer machining quality in the slicing step S12, the abrasive grains need to satisfy a certain quality criterion. Thus, the abrasive grains are inspected in terms of quality before actual use in the slicing step S12.

Figure 3:
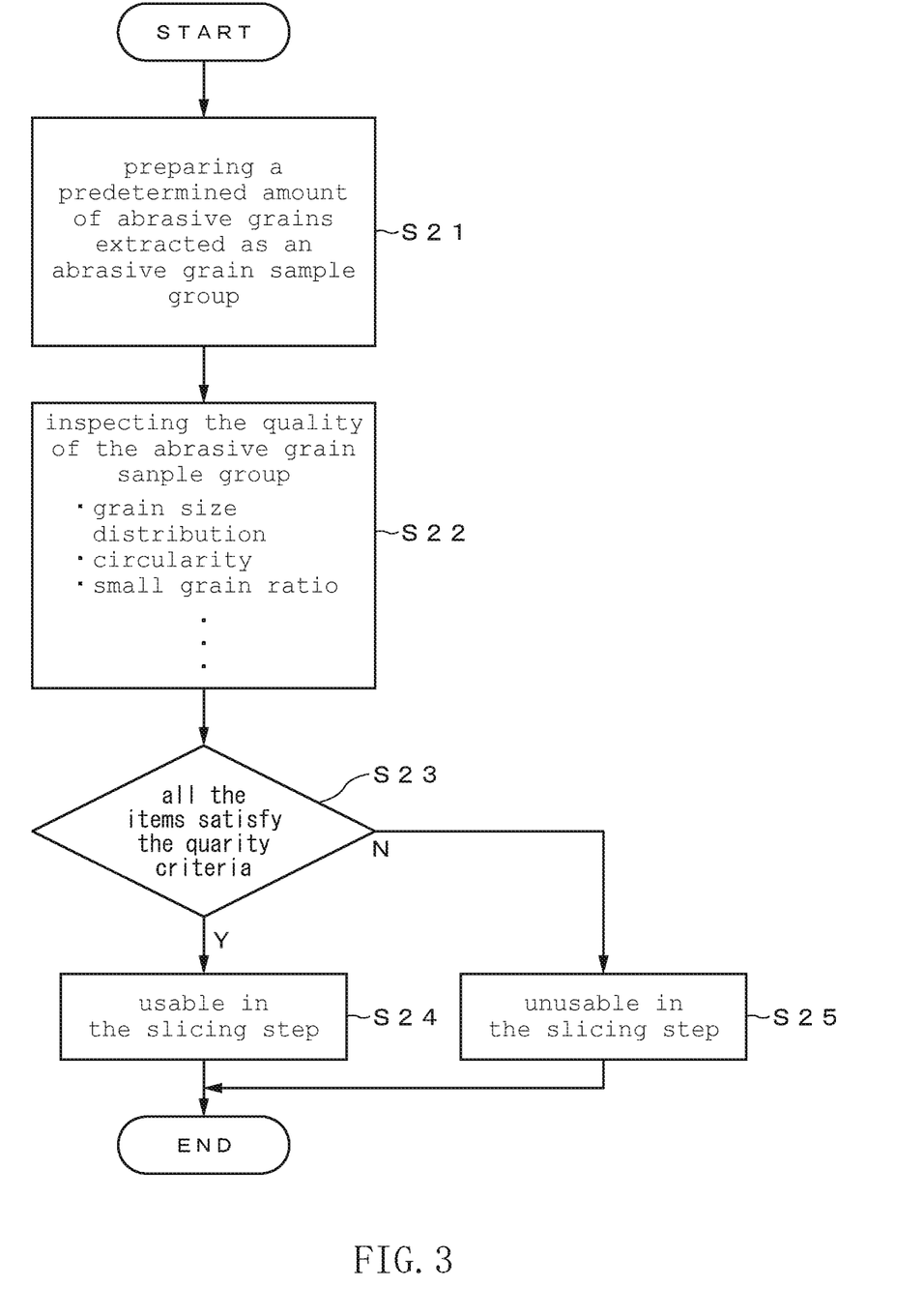
FIG. 3 is a flowchart schematically illustrating the abrasive grain inspection step.

FIG. 3 is a flowchart schematically illustrating the abrasive grain inspection step.

As illustrated in FIG. 3, in the abrasive grain inspection step, first a predetermined amount of abrasive grains extracted as an abrasive grain sample group from an abrasive grain lot are prepared (step S21), and the prepared abrasive grains are inspected in terms of quality (step S22). Quality evaluation items can include "grain size distribution", "circularity", "small grain ratio", and the like. When the result of the quality inspection of the abrasive grains reveals that the values of all the quality evaluation items satisfy their corresponding criteria, it is determined that the abrasive grains that have been subjected to the inspection is usable in the slicing step (Y in steps S23 and S24), while when the value of at least one of the quality evaluation items does not satisfy its corresponding criterion, it is determined that the abrasive grains is unusable (N in steps S23 and S25).

The "small grain ratio", which is one of the quality evaluation items, is an index that indicates the ratio (number ratio) of small grains (fine grains) occupied in the abrasive grain sample group and that has heretofore not been adopted as a quantitative index. The small grains do not contribute to the cutting of the ingot and what is worse, are obstacles of the cutting performance of, mainly, medium-size abrasive grains contributing to the cutting of the ingot, so that when the amount of the small grains contained in the abrasive grain sample group is large, the flatness of the wafer after slicing may be deteriorated. However, when the small grain ratio is reduced to a certain level or less, the flatness of the wafer after slicing can be made satisfactory, whereby wafer machining quality can be stabilized.

In the present embodiment, the grain diameter of the small grains is preferably equal to or smaller than ½ of the average grain diameter in a grain size distribution based on the volume of the abrasive grain sample group. By monitoring the grain diameter of abrasive grains fall within this range, the quality of the abrasive grains can be stabilized and, thus, wafer machining quality can be improved. Further, when the grain diameter criterion for determining the small grain is set to equal to or smaller than ½ of the average grain diameter, the definition of the small grain is clear to make it easy to set the grain diameter criterion based on a grain size distribution, facilitating identification of the small grains that have influence on wafer machining quality.

The small grain ratio of the abrasive grains is preferably 50% or less. When the small grain ratio is 50% or less, the flatness of the wafer after slicing can be made satisfactory on the whole to make it possible to stabilize wafer machining quality, while when the small grain ratio exceeds 50%, the flatness of the wafer deteriorates, with the result that the wafer does not satisfy a predetermined quality criterion.

Figure 4A:
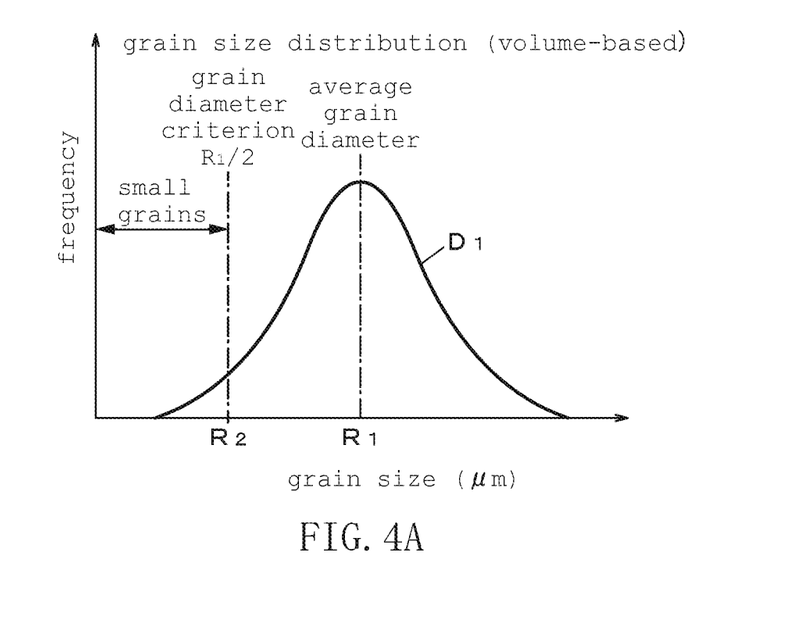
FIGS. 4A and 4B are each a grain size distribution graph for explaining a small grain ratio calculation method.
Figure 4B:
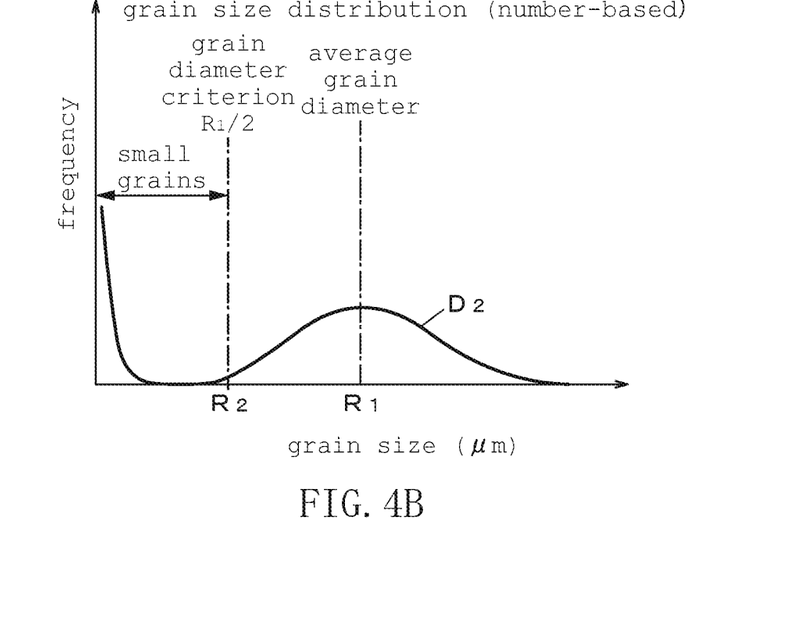

FIGS. 4A and 4B are each a grain size distribution graph for explaining a small grain ratio calculation method.

In the calculation of the small grain ratio, first the grain diameters of individual abrasive grains in the abrasive grain sample group are measured, and a grain size distribution $D_1$ based on the volume of the entire abrasive grain sample group as illustrated in FIG. 4A is calculated. A method of measuring the grain diameters of the individual abrasive grains is not particularly limited. For example, the abrasive grains are photographed one by one while making a liquid containing the abrasive grains flow in a flow path between cells of thin glass, followed by image processing, whereby the grain diameters of the individual abrasive grains can be measured.

Then, an average grain diameter $R_1$ of the volume-based grain size distribution $D_1$ of the abrasive grain sample group is calculated, and the grain diameter having ½ of the average grain diameter is set as a grain diameter criterion $R_2$ ($=0.5R_1$) for the small grains. Thus, the small grains are defined as abrasive grains having a grain diameter of the grain diameter criterion $R_2=R_1/2$ or smaller.

Then, on the basis of a grain size distribution $D_2$ based on the number of the abrasive grain sample group as illustrated in FIG. 4B, the number of the small grains having a diameter equal to or smaller than ½ of the average grain diameter $R_1$ is counted, and the small grain ratio which is the number ratio of the small grains occupied in the abrasive grain sample group is calculated.

When the small grain ratio is equal to or smaller than a predetermined threshold value, it is determined that the extracted abrasive grain sample group is usable in the slicing step. On the other hand, when the small grain ratio is larger than the threshold value, it is determined that the extracted abrasive grain sample group is unusable in the slicing step. The threshold value for the small grain ratio is preferably 50% or less. When the small grain ratio exceeds 50%, the flatness indices of the silicon wafer, such as GBIR (Global Backside Ideal focal plane Range), Warp, and nanotopography, deteriorate, with the result that the wafer does not satisfy a predetermined quality criterion.

As described above, the abrasive grain evaluation method according to the present embodiment includes measuring the volume-based grain size distribution $D_1$ of the entire abrasive grain sample group, counting the number of small grains distributed in an area equal to or smaller than ½ of the average grain diameter $R_1$ of the grain size distribution $D_1$, determining whether the small grain ratio which indicates the number ratio of small grains occupied in the abrasive grain sample group is 50% or less, and slicing the ingot using a slurry containing the abrasive grains extracted as the abrasive grain sample group when obtaining an affirmative result (50% or less). Thus, it is possible to improve the flatness of the wafer cut off by the loose grain wire saw and to stabilize wafer machining quality.

While the preferred embodiment of the present invention has been described, the present invention is not limited to the above embodiment, and various modifications may be made within the scope of the present invention, and all such modifications are included in the present invention.

For example, in the above embodiment, the value ½ of the average grain diameter of the volume-based grain size distribution of the abrasive grain sample group is set as the grain diameter criterion, the grain diameter criterion is not limited to the value ½ thereof. Further, the value ½ of the average grain diameter of the number-based grain size distribution of the abrasive grain sample group is set as the grain diameter criterion.

Further, although the silicon single crystal ingot is subjected to slicing in the above embodiment, the present invention is not limited to this, and an ingot of any material may be subjected to slicing.

Examples

Two abrasive grain sample groups A and B extracted from different lots were prepared, and the volume-based and number-based grain size distributions of each of the groups A and B were measured. In the measurement of the grain size distribution, the diameters of the individual sample abrasive grains were measured using a particle size/shape analyzer FPIA-3000 made by Sysmex Corporation.

Figure 5:
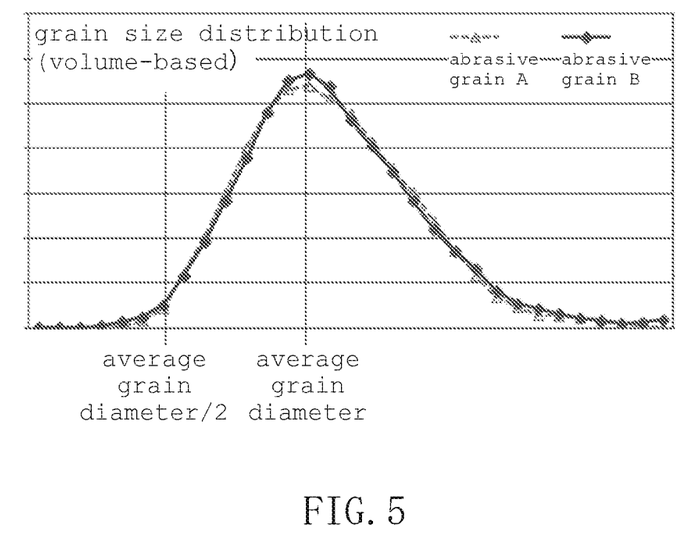
FIG. 5 is a graph illustrating the volume-based grain size distributions of the abrasive grain sample groups A and B.

FIG. 5 is a graph illustrating the volume-based grain size distributions of the abrasive grain sample groups A and B. The horizontal axis represents abrasive grain size (μm), and the vertical axis represents frequency (volume ratio). As is clear from the graph of FIG. 5, there is almost no difference between the volume-based grain size distributions of the abrasive grain sample groups A and B.

Figure 6:
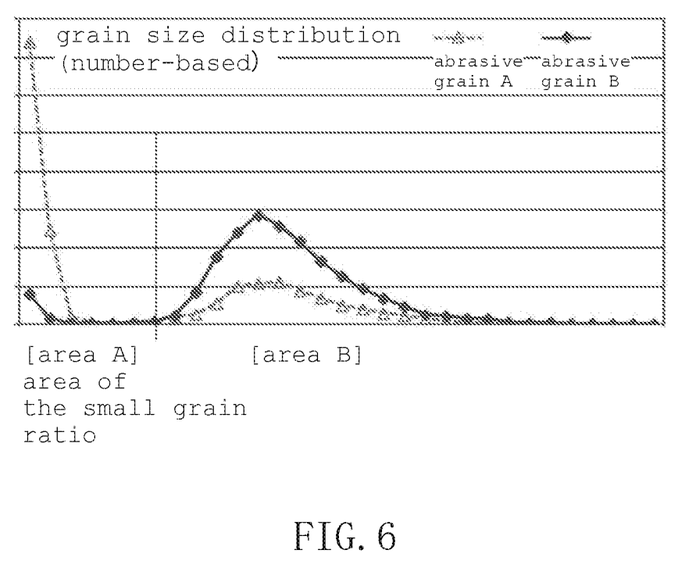
FIG. 6 is a graph illustrating the number-based grain size distributions of the abrasive grain sample groups A and B.

FIG. 6 is a graph illustrating the number-based grain size distributions of the abrasive grain sample groups A and B. The horizontal axis represents abrasive grain size (μm), and the vertical axis represents frequency (number ratio). As is clear from the graph of FIG. 6, the abrasive grain sample group B contains much more fine grains than the abrasive grain sample group A. Further, the existence of the small grains which can hardly be confirmed in the volume-based grain size distribution (FIG. 5) can easily be confirmed in the number-based grain size distribution (FIG. 6). The small grain ratios of the abrasive grain sample groups A was 10%, and the small grain ratios of the abrasive grain sample groups B was 70%.

Next, five abrasive grain sample groups C1 to C5 having different small grain ratios were prepared. The small grain ratios of the abrasive grain sample groups C1 to C5 were 10%, 30%, 50%, 70%, and 90%, respectively. Then, the abrasive grain sample groups C1 to C5 were used to slice a silicon single crystal ingot using a wire saw. Thereafter, GBIR which is the flatness index of the obtained wafer was measured for each of the sample groups. The GBIR is a global flatness index with the back side of the wafer used as a reference and is defined by the difference between the maximum and minimum values of thickness measured with the back side as a reference.

Figure 7:
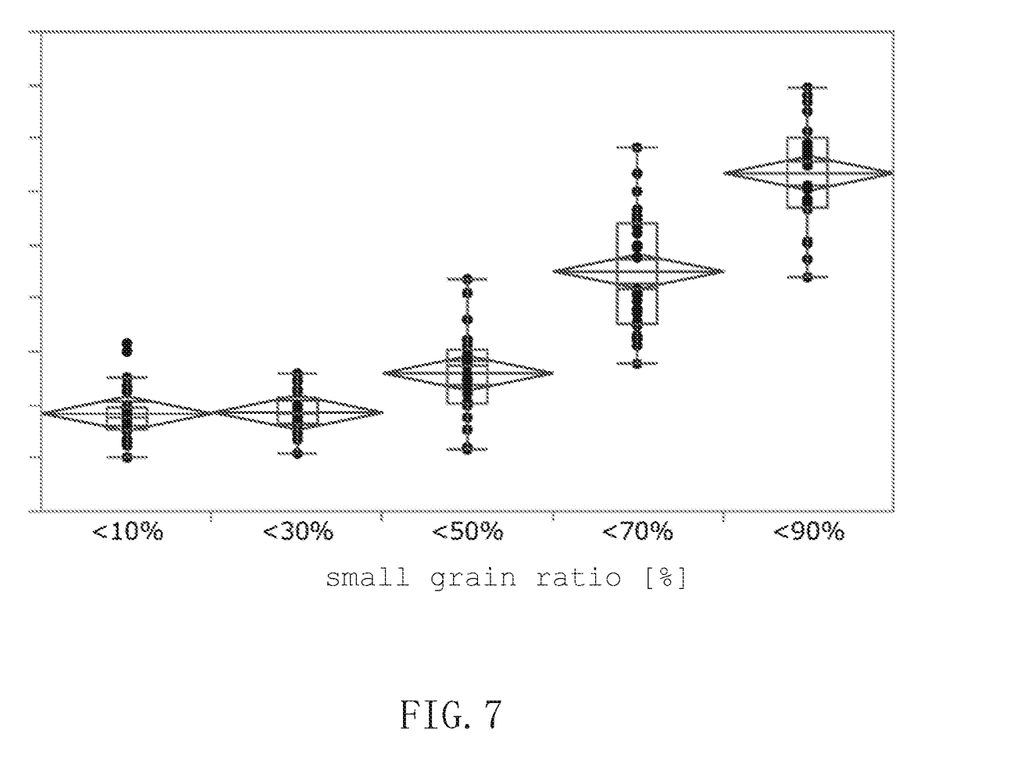
FIG. 7 is a graph (box and whisker diagram) illustrating the GBIR values of the wafers subjected to slicing using the abrasive grain sample groups C1 to C5.

FIG. 7 is a graph (box and whisker diagram) illustrating the GBIR values of the wafers subjected to slicing using the abrasive grain sample groups C1 to C5. The horizontal axis represents the small grain ratio (%), and the vertical axis represents GBIR (standard value). As can be seen from the graph, the GBIR values of the abrasive grain sample group C1 having a small grain ratio of 10% and of the abrasive grain sample group C2 having a small grain ratio of 30% are small, while the GBIR value of the abrasive grain sample group C3 having a small grain ratio of 50% becomes slightly larger. The GBIR values of the abrasive grain sample group C4 having a small grain ratio of 70% and of the abrasive grain sample group C5 having a small grain ratio of 90% become further larger. Thus, it can be understood that the abrasive grain group having a small grain ratio of 50% or less can make the wafer flatness satisfactory.

REFERENCE SIGNS LIST 1 loose grain wire saw
2 silicon single crystal ingot
10A, 10B, 10C main rollers
11 wire
12A, 12B reels
11R wire lines
13 guide roller
14A, 14B tension adjusting mechanisms
15 dancer roller
16 dancer arm
17 actuator
18 lifting device
20A and 20B slurry nozzles
$D_1$ grain size distribution of the abrasive grain sample group (volume-based)
$D_2$ grain size distribution of the abrasive grain sample group (number-based)
$R_1$ average grain diameter of the grain size distribution $D_1$
$R_2$ grain diameter criterion ($R_1/2$)
S11 outer periphery grinding
S12 slicing
S13 lapping
S14 etching
S15 double-sided polishing
S16 single-sided polishing
S17 cleaning

What is claimed is:

1. An abrasive grain evaluation method comprising:
preparing a predetermined amount of abrasive grains as an abrasive grain sample group;
measuring the grain diameters of individual abrasive grains in the abrasive grain sample group and counting the number of the abrasive grains in the abrasive grain sample group;
defining abrasive grains having a grain diameter equal to or smaller than a predetermined diameter criterion which is smaller than the average grain diameter of the abrasive grain sample group as small grains and counting the number of the small grains, wherein the predetermined diameter criterion is ½ of the average grain diameter;
calculating a small grain ratio which is the number ratio of the small grains occupied in the abrasive grain sample group; and
determining whether or not the small grain ratio is equal to or smaller than a predetermined threshold value, wherein the predetermined threshold value is 50%;
wherein when the small grain ratio is equal to or smaller than the predetermined threshold value, it is determined that the abrasive grain sample group can be used in slicing of an ingot by a wire saw, while when the small grain ratio is larger than the predetermined threshold value, it is determined that the abrasive grain sample group cannot be used in the slicing.

2. The abrasive grain evaluation method as claimed in claim 1 includes:
- measuring the grain size distribution based on the volume of the abrasive grain sample group from the grain diameters of the individual abrasive grains in the abrasive grain sample group;
- calculating the average grain diameter of the abrasive grain sample group from the measured grain size distribution; and
- defining the abrasive grains distributed in an area equal to or smaller than a grain diameter criterion which is smaller than the average grain diameter, as the small grains, wherein the grain diameter criterion is ½ of the average grain diameter.

3. A wafer manufacturing method comprising:
- evaluating abrasive grains according to the method of claim 1; and
- slicing an ingot using a loose grain wire saw with a slurry containing abrasive grains that have been determined can be used in slicing of an ingot by a loose grain wire saw.

* * * * *